(12) United States Patent
Saito et al.

(10) Patent No.: US 8,981,561 B1
(45) Date of Patent: Mar. 17, 2015

(54) SEMICONDUCTOR DEVICE AND METHOD OF MANUFACTURING THE SAME

(71) Applicant: Kabushiki Kaisha Toshiba, Minato-ku, Tokyo (JP)

(72) Inventors: Tatsuro Saito, Yokkaichi (JP); Makoto Wada, Yokkaichi (JP); Atsunobu Isobayashi, Yokkaichi (JP); Akihiro Kajita, Yokkaichi (JP); Hisao Miyazaki, Yokohama (JP); Tadashi Sakai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/202,683

(22) Filed: Mar. 10, 2014

(30) Foreign Application Priority Data

Aug. 29, 2013 (JP) ................... 2013-178713

(51) Int. Cl.
*H01L 23/532* (2006.01)
*H01L 23/48* (2006.01)
*H01L 21/768* (2006.01)

(52) U.S. Cl.
CPC ........ *H01L 23/481* (2013.01); *H01L 21/76877* (2013.01); *Y10S 977/754* (2013.01); *Y10S 977/932* (2013.01)
USPC ............................ 257/741; 977/754; 977/932

(58) Field of Classification Search
USPC .......... 257/734, 741, 746; 977/754, 762, 788, 977/842, 932
See application file for complete search history.

(56) References Cited

U.S. PATENT DOCUMENTS

| | | | |
|---|---|---|---|
| 7,683,528 B2 * | 3/2010 | Tsukamoto et al. .......... | 313/309 |
| 8,518,542 B2 * | 8/2013 | Hiraki et al. .................. | 428/408 |
| 2002/0009637 A1 * | 1/2002 | Murakami et al. ............ | 429/213 |
| 2002/0047513 A1 * | 4/2002 | Nomura ........................ | 313/495 |
| 2003/0006684 A1 * | 1/2003 | Kawate et al. ................ | 313/311 |
| 2005/0116601 A1 * | 6/2005 | Shimazu et al. .............. | 313/309 |
| 2005/0153619 A1 * | 7/2005 | Oyama et al. ................... | 445/50 |
| 2006/0292861 A1 * | 12/2006 | Furukawa et al. ............ | 438/627 |
| 2008/0150152 A1 * | 6/2008 | Dijon et al. ................... | 257/774 |
| 2008/0237858 A1 * | 10/2008 | Nihei ............................. | 257/746 |
| 2008/0246149 A1 * | 10/2008 | Kwak et al. ................... | 257/751 |
| 2009/0146304 A1 * | 6/2009 | Son et al. ...................... | 257/750 |
| 2010/0244262 A1 * | 9/2010 | Awano et al. ................. | 257/758 |
| 2011/0057322 A1 * | 3/2011 | Matsunaga et al. ........... | 257/774 |
| 2011/0147177 A1 * | 6/2011 | Sakai et al. ................... | 200/181 |
| 2011/0233779 A1 | 9/2011 | Wada et al. | |
| 2012/0052680 A1 * | 3/2012 | Sakuma et al. ............... | 438/675 |
| 2013/0072077 A1 * | 3/2013 | Steiner et al. .................. | 442/59 |

FOREIGN PATENT DOCUMENTS

JP 2011238726 A * 11/2011
JP 2012038888 A * 2/2012

* cited by examiner

*Primary Examiner* — Michele Fan
(74) *Attorney, Agent, or Firm* — Holtz, Holtz, Goodman & Chick PC

(57) ABSTRACT

According to one embodiment, a semiconductor device in which CNTs are used for a contact via comprise a substrate including a contact via groove, a catalyst layer for CNT growth which is formed at the bottom of the groove, and a CNT via formed by filling the CNTs into the groove in which the catalyst layer is formed. Each of the CNTs is formed by stacking a plurality of graphene layers in a state in which they are inclined depthwise with respect to the groove, and formed such that ends of the graphene layers are exposed on a sidewall of the CNT. Further, the CNT is doped with at least one element from the sidewall of the CNT.

8 Claims, 5 Drawing Sheets

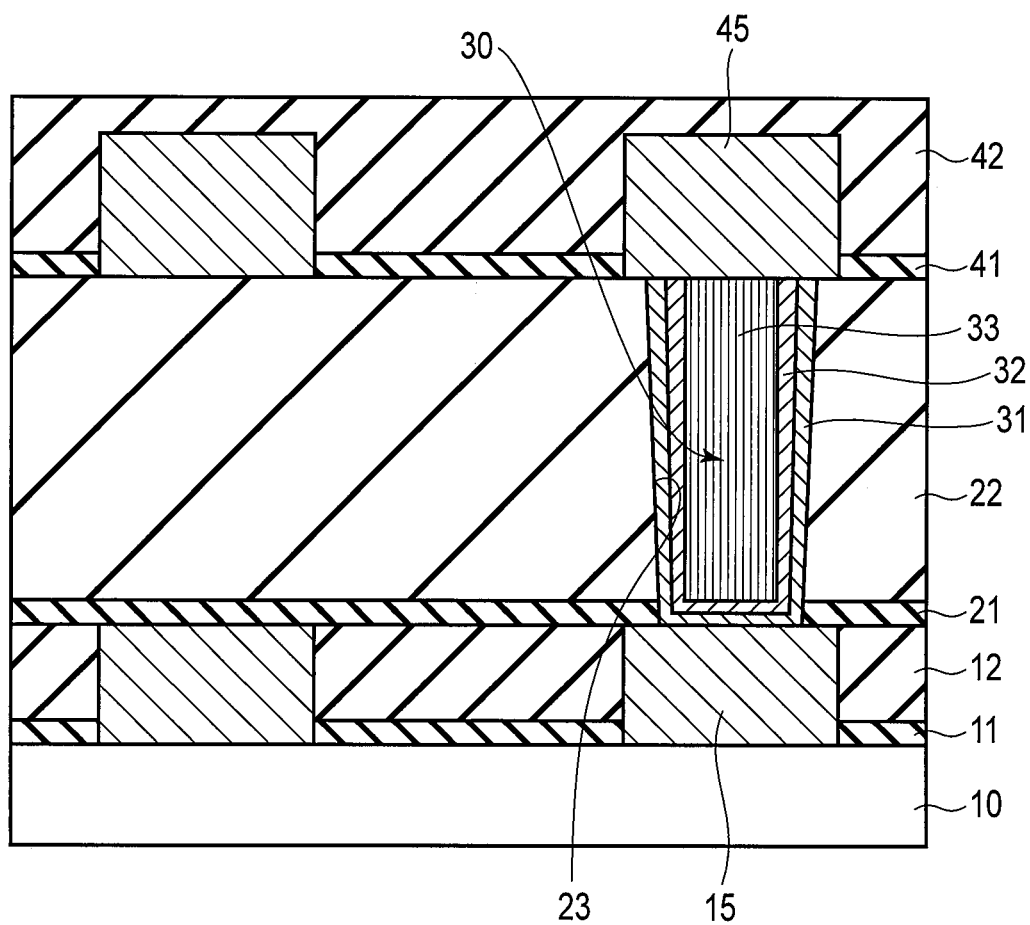
F I G. 1

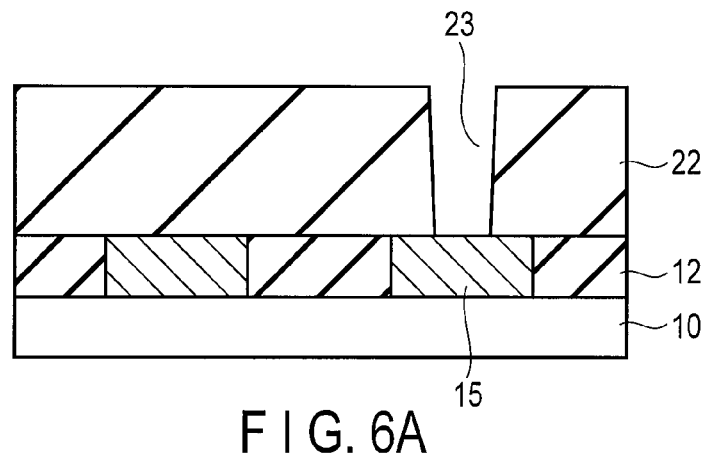
F I G. 6A
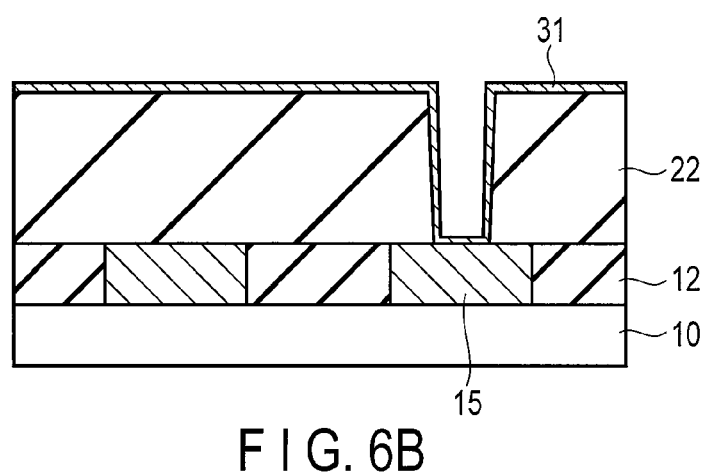
F I G. 6B
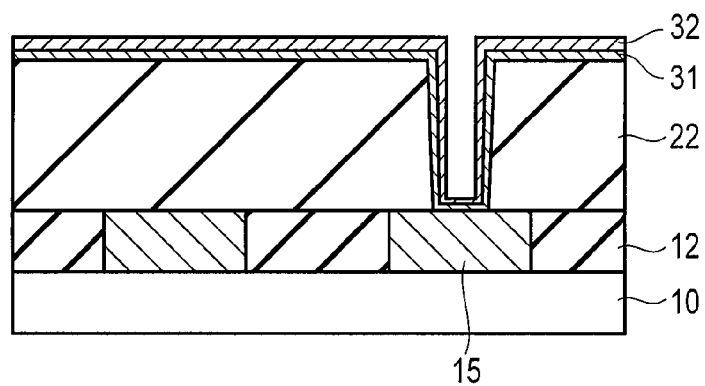
F I G. 6C

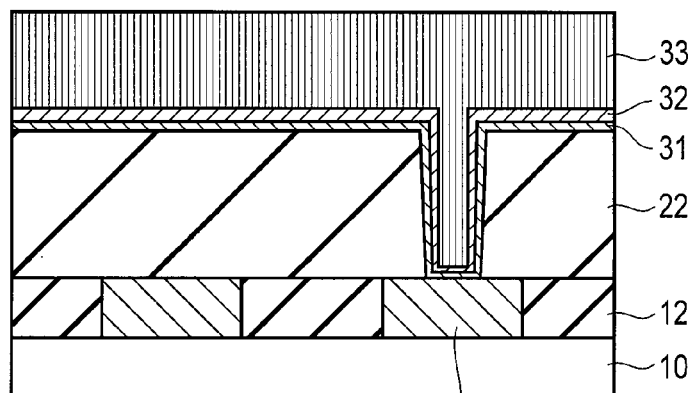
F I G. 6D
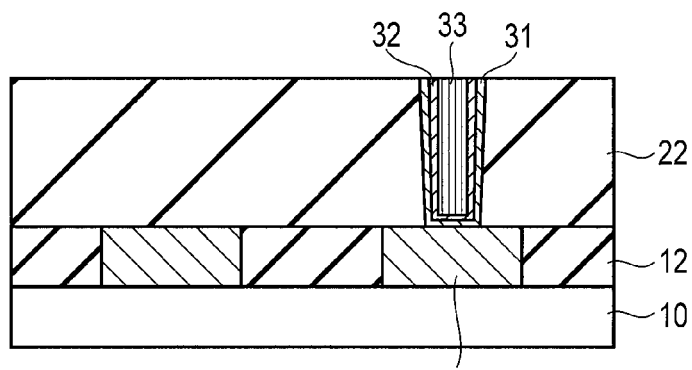
F I G. 6E
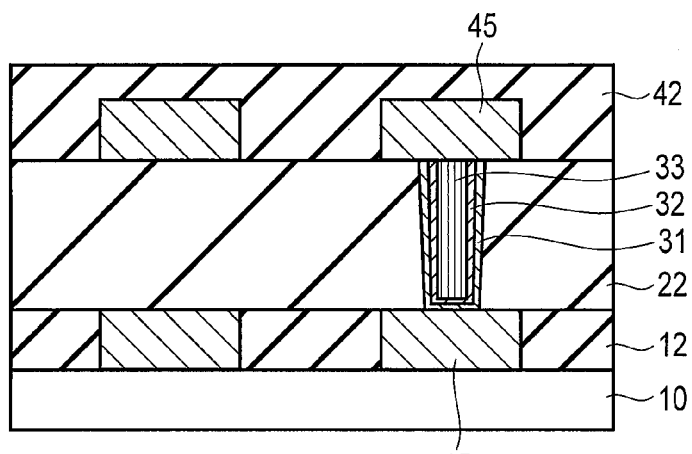
F I G. 6F

SEMICONDUCTOR DEVICE AND METHOD OF MANUFACTURING THE SAME

CROSS-REFERENCE TO RELATED APPLICATIONS

This application is based upon and claims the benefit of priority from Japanese Patent Application No. 2013-178713, filed Aug. 29, 2013, the entire contents of which are incorporated herein by reference.

FIELD

Embodiments described herein relate generally to a semiconductor device and a method of manufacturing the same.

BACKGROUND

Recently, a method for forming carbon nanotubes (CNTs) within a via between multilayer interconnects of a semiconductor device has been proposed with a view to reducing interconnect resistance. Because of their quantization conductivity, CNTs offer the possibility of forming low-resistance interconnects in an LSI and so replacing metal interconnects. Further, since the structure of a CNT is tubular, and vertical deposition by the CVD method is possible, this technique is excellently compatible with the conventional vertical interconnect formation process of a device.

As described above, a CNT is a new material which is expected to have excellent electrical properties in vertically arranged interconnects. With such CNTs, it is possible to realize low-resistance interconnects, particularly when the distance between interconnects is great. On the other hand, to apply CNTs to contacts, a measure for increasing their mean free path is important. For example, the measure which can be taken is doping the CNTs with an element such as boron (Br) or nitrogen (N) and so increasing the carriers transported.

BRIEF DESCRIPTION OF THE DRAWINGS

FIG. 1 is a cross-sectional view showing a schematic structure of a semiconductor device according to a first embodiment;

FIGS. 6A to 6F are cross-sectional views showing a manufacturing process of a semiconductor device according to a second embodiment.

DETAILED DESCRIPTION

Figure 2A:
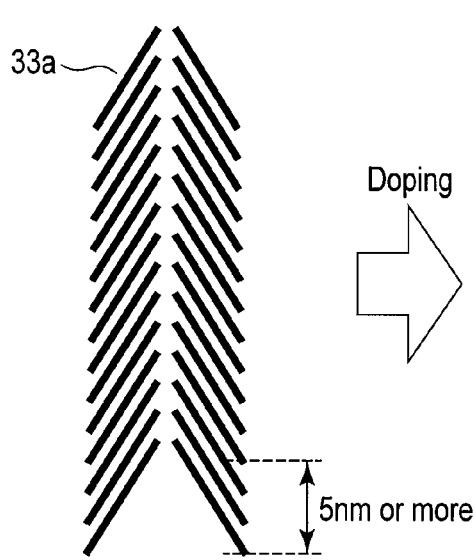
FIGS. 2A and 2B are schematic diagrams for use in indicating an enlarged structure of a CNT used for the semiconductor device of FIG. 1 and a state of element doping.

In general, according to one embodiment, a semiconductor device in which CNTs are used for a contact via comprises a substrate comprising a contact via groove, a catalyst layer for CNT growth which is formed at the bottom of the groove, and a CNT via formed by filling the CNTs into the groove in which the catalyst layer is formed. Each of the CNTs is formed by stacking a plurality of graphene layers in a state in which they are inclined depthwise with respect to the groove, and formed such that ends of the graphene layers are exposed on a sidewall of the CNT. Further, the CNT is doped with at least one element from the sidewall of the CNT.

The semiconductor device and a method of manufacturing the same according to the embodiment will be hereinafter described with reference to the accompanying drawings.

First Embodiment

FIG. 1 is a cross-sectional view showing a schematic structure of a semiconductor device according to a first embodiment.

The present embodiment relates to a structure in which a contact layer for connecting between a semiconductor element and an interconnect layer or between interconnect layers is formed on a substrate on which semiconductor elements such as a transistor and a capacitor are formed. Above all, the aforementioned structure particularly relates to one which uses CNTs as the contact layer material. Further, this structure relates to doping the CNTs with at least one element and applying the CNTs comprising graphene wall ends exposed on the CNT layer sidewalls to a contact.

Reference numeral 10 in the figure indicates an Si substrate (semiconductor substrate) on which elements such as a transistor and capacitor are formed. On the substrate 10, a cap layer 11 of $SiO_2$, SiOC, etc., which functions as a stopper insulating film, and an interconnect layer insulating film 12 of $SiO_2$, etc., are formed. Further, an interconnect groove is formed in the insulating film 12, and an underlayer interconnect 15 is formed by filling a metal film into the interconnect groove.

The cap layer 11 and cap layers 21 and 41 to be described later can be omitted if a ground insulating film is a film resistant to RIE damage, which is made of, for example, TEOS or SiOC which does not include minute holes.

On the substrate 10 on which the underlayer interconnect 15 is formed, the cap layer 21 of SiN, etc., and an interlayer insulation film 22 of $SiO_2$, etc., are formed. In the interlayer insulation film 22 which is above the underlayer interconnect 15, a contact via groove 23 is formed.

In the contact via groove 23, a plurality of CNTs 33 are formed by the intermediary of an auxiliary catalyst layer 31 of Ti, TiN, etc., and a catalyst layer 32 of Ni, Co, etc. A CNT via 30 for connecting between the upper and lower interconnect layers is thereby structured. Here, each of the CNTs 33 grows upward from the bottom of the catalyst layer 32.

As described above, on the substrate on which the CNT via 30 is formed, a cap layer 41 of SiN, etc., an insulating film 42 of $SiO_2$, etc., and an upper interconnect layer 45 of Cu, etc., are formed.

The insulating film 42 may be lamination of an interconnect layer insulating film and an interlayer insulating film, or formed by an interlayer insulating film alone. In the case of lamination, after forming the interconnect layer insulating film including a groove for interconnection, the upper interconnect layer 45 is formed by filling a metal film into the groove, and the interlayer insulating film is formed on the upper interconnect layer 45 and the interconnect layer insulating film. In the case where the insulating film 42 is not formed as a laminated structure, after forming the upper interconnect layer 45, the interlayer insulating film may be formed in such a way as to cover the upper interconnect layer 45.

The auxiliary catalyst layer 31 is an auxiliary film for facilitating the formation of the CNTs, and prevents diffusion of the components of the catalyst layer 32 from the catalyst layer 32 to the insulating film and an underlayer contact. As typical materials of the auxiliary catalyst layer 31, Ta, Ti, Ru, W, Al, and the like, may be adopted. A nitride or an oxide of a film made from these elements, or a laminating material including such films may also be used.

The catalyst layer 32 is a layer necessary for forming the CNTs. As a catalyst material of the catalyst layer 32, it is preferred that a single element metal, such as Co, Ni, Fe, Ru, and Cu, an alloy including at least one of the aforementioned elements, or a carbide thereof or the like be used. The catalyst layer of the CNT should preferably be a discontinuous film which is in a dispersion state. Here, for the purpose of immobilizing the CNTs formed in the contact via, an insulating film or metal formed by the CVD method, for example, may be filled.

Further, deposition may be carried out such that a diffusion barrier layer, which is not shown, covers the interconnect structure. For the diffusion barrier layer, SiN, for example, is used. Further, the CNTs to be used are featured in that a plurality of graphene walls exist at the outermost part of each of the CNTs, and a constituent element is not C alone.

Figure 2B:
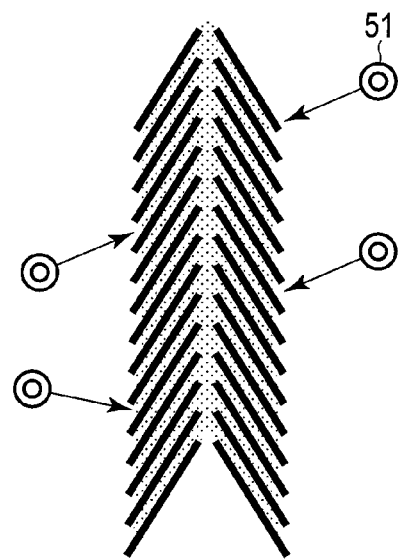

Each of the CNTs 33 in the CNT via 30 is formed to be a cup-stacked CNT. That is, as shown in FIG. 2A, a plurality of graphene layers 33a are stacked in a state in which they are inclined depthwise with respect to the contact via groove 23, and ends of the graphene layers 33a are exposed on the sidewall of the CNT. The height of one graphene layer 33a is 5 nm or more. Further, as shown in FIG. 2B, from the sidewall of the CNT 33, the graphene layers 33a are doped with least one kind of element 51.

Here, graphene is an extremely thin carbon material formed by stacking about 1 to 100 layers of film including benzene rings arranged regularly on a plane. Further, an ordinary CNT has a tubular structure having a diameter of 10 to 100 nm and is made of graphene, which is a carbon material of stacked films each including benzene rings arranged regularly on a plane.

As in the present embodiment, as the CNT in which graphene wall ends are exposed on the CNT layer sidewall, a cup-stacked CNT, for example, is known. The cup-stacked CNT has a stacked structure of graphene layers which is shaped like a test tube. As the feature, because of the fact that one graphene layer is not connected from end to end of the CNT, it is known that a mean free path becomes small and the resistance becomes high with a single graphene layer. However, since the end of the CNT is positioned at the sidewall, a doping path of an element exists at the sidewall of the CNT. Further, from the standpoint of structure, because the CNT extends longitudinally, it is possible to secure a stable position of allowing other elements to exist.

By virtue of the above feature, the CNTs can be sufficiently doped with an element, and carriers to be transported can be increased. That is, the above structure enables to achieve low resistance of the contact via. Further, from the standpoint of the process, in the CNT in which the graphene wall ends are exposed on the CNT layer sidewall, growth of CNTs at low temperatures is possible. Accordingly, the present embodiment has an advantage of being able to realize a process which can be applied to various devices.

Figure 3:
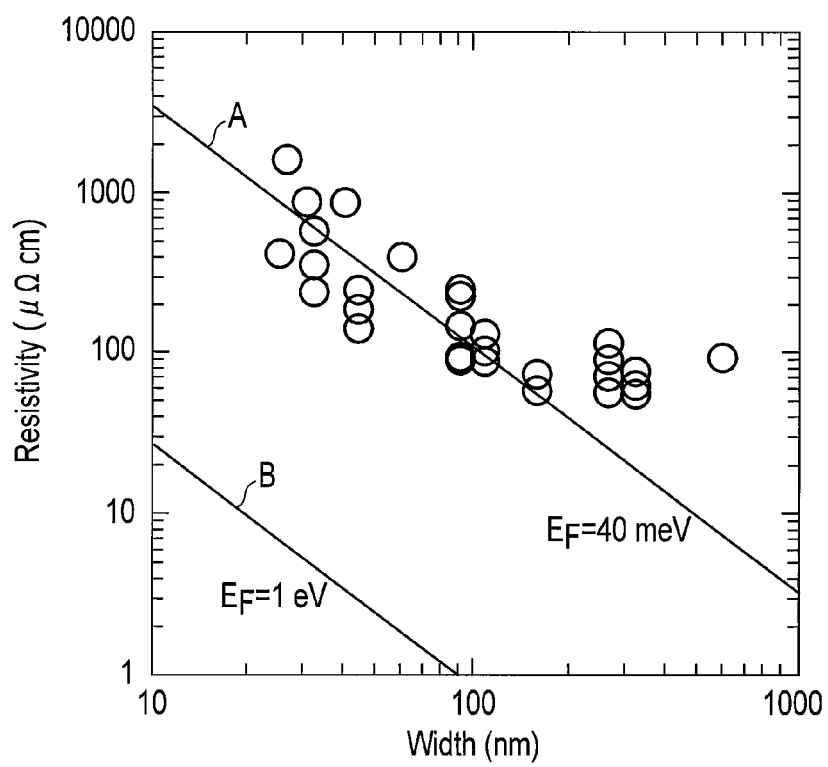
FIG. 3 is a characteristic diagram showing the relationship between the line width and the volume resistivity of graphene.

FIG. 3 is a diagram showing the relationship between the volume resistivity and the line width of graphene, and representing low resistance realization by Br doping. The volume resistivity is reduced by two orders of magnitude in B with doping as compared to A without doping.

Figure 4A:
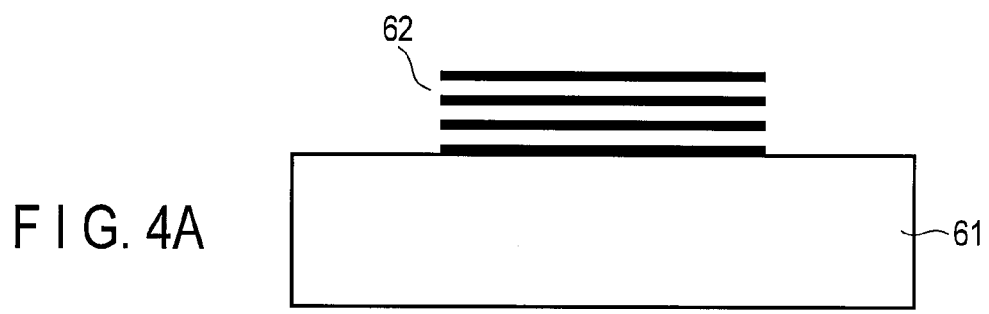
FIGS. 4A and 4B are cross-sectional views for use in showing an example of element doping for graphene.
Figure 4B:
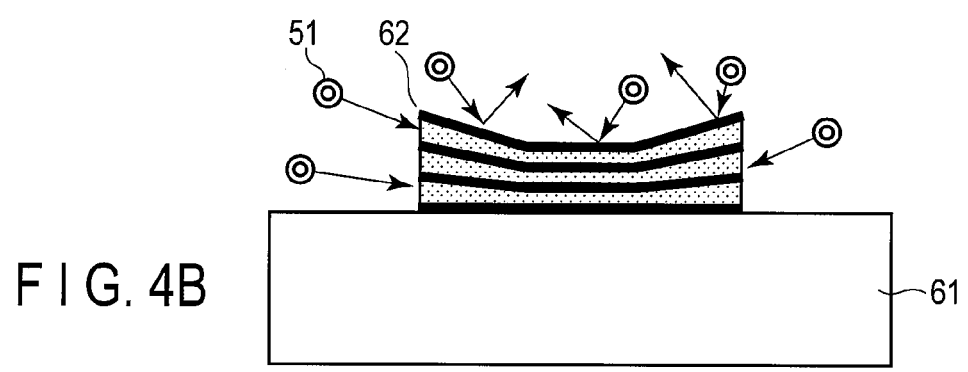

As regards the doping for the graphene, as shown in FIG. 4A, if the graphene layers 62 are stacked on a substrate 61, Br is to be doped from a transverse direction as shown in FIG. 4B. In this way, atoms 51 enter from sidewalls or defects of the graphene layers 62, which increase the space between the graphene layers so that the resistance can be reduced.

Figure 5:
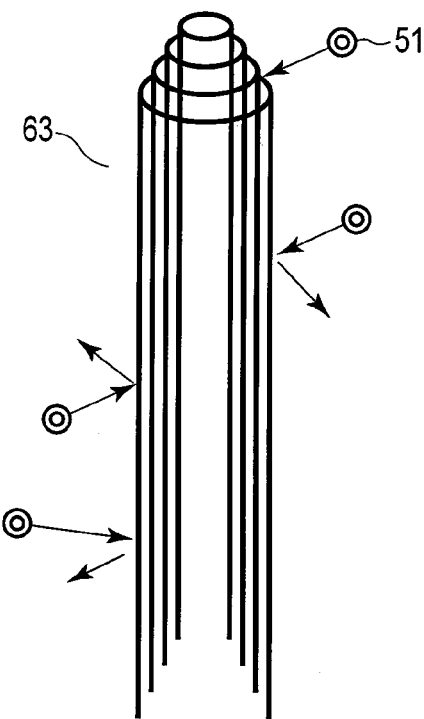
FIG. 5 is a schematic diagram showing an example of element doping for a CNT.

Meanwhile, as shown in FIG. 5, in the case of (multi-walled) hollow structure CNTs 63, atoms 51 can enter only from the distal end. Accordingly, the diameter is not increased, and it is extremely difficult to achieve low resistance as in the stacked graphene layers. That is, if the doping is applied to such hollow structured CNTs, doping paths to places other than the outermost CNT layer are only the distal ends of the CNTs or defective parts of an outer shell CNT, and so the diameters of the CNTs are barely widened. Accordingly, element doping cannot be performed for the CNTs stably, and it is difficult to obtain a sufficient advantage.

In contrast, in the present embodiment, as shown in FIGS. 2A and 2B, the CNT via 30 is constituted not by an ordinary CNT but by the cup-stacked CNT 33 in which the graphene layers are stacked in a state in which they are inclined depthwise with respect to the groove for via. Accordingly, on the side surface of the CNT 33, the ends of the graphene layers are exposed, and doping of the element 51 can be carried out stably from the side surface of the CNT 33. In this way, it is possible to reduce the resistance of the CNT via 30.

As described above, according to the present embodiment, each of the CNTs 33 which constitute the CNT via 30 has a cup-stacked structure. Therefore, an element, such as Br, can be efficiently doped from the side surface of each of the CNTs 33, and thus, it is possible to further reduce the resistance of the CNT via 30. Accordingly, in a semiconductor device which uses the CNT via 30, it is possible to further reduce the interconnect resistance.

Second Embodiment

FIGS. 6A to 6F are cross-sectional views showing a manufacturing process of a semiconductor device according to a second embodiment.

Note that the semiconductor device manufactured in the present embodiment has a structure similar to that shown in FIG. 1. Further, in order to facilitate the explanation, a cap layer is omitted.

First of all, as shown in FIG. 6A, on an Si substrate 10 on which semiconductor elements, such as transistors and capacitors, are formed, an interconnect layer insulating film 12 and an underlayer interconnect layer 15 are formed. Here, a TEOS film, for example, is used for the interconnect layer insulating film 12, and metal, such as W, Cu, and Al, is used for the material of the underlayer interconnect layer 15. It is assumed that the underlayer interconnect layer 15 is formed in various thicknesses and widths.

Next, on the insulating film 12 and the interconnect layer 15, an interlayer insulation film 22 is formed. The insulating film 22 is an SiOC film, for example, and formed by the CVD method or coating method, for example. The insulating film 22 may be a film which includes pores for the purpose of reducing the dielectric constant. After that, subsequent to a resist coating/lithography step which is not shown, for only at the place where a CNT via is to be formed, a via hole 23 is formed by RIE processing.

Next, as shown in FIG. 6B, an auxiliary catalyst layer 31, which serves as an auxiliary film for facilitating the manufacturing of the CNTs, is formed in the via hole 23 and on the insulating film 22. It is preferred that the auxiliary catalyst layer 31 be formed evenly at the bottom and the side of the via hole. As the method for deposition, the CVD method, for example, may be used. As typical materials of the auxiliary catalyst layer 31, Ta, Ti, Ru, W, Al, and the like, may be adopted. A nitride or an oxide of a film made from these elements, or a laminating material including such films, can also be used.

Next, as shown in FIG. 6C, a catalyst layer 32 for CNT growth is formed on the auxiliary catalyst layer 31. Thus, in the via hole 23, the auxiliary catalyst layer 31 and the catalyst layer 32 are formed at the bottom and the sidewall. As the method of forming the catalyst layer 32, the CVD method, for example, is used. As the material of the catalyst layer 32, it is preferred that a single element metal, such as Co, Ni, Fe, Ru, and Cu, an alloy including at least one of the aforementioned elements, or a carbide thereof or the like be used. The catalyst layer 32 should preferably be a discontinuous film which is in a dispersion state.

Next, as shown in FIG. 6D, CNTs 33 which serve as electrical interconnect layers are formed. For the formation of the CNTs 33, the CVD method is used. For a carbon source, a hydrocarbon-based gas, such as methane and acetylene, or a mixture thereof is used, and for a carrier gas, hydrogen or an inert gas is used. The CNTs 33 are characterized in that they are formed on only the catalyst layer 32 which has become the discontinuous film. Here, to achieve the structure of the CNTs 33, in particular, to be one that the graphene wall ends are exposed on the CNT layer sidewall in each of the CNTs 33, the temperature when the CNTs 33 are grown and the concentration of the raw material of the CNTs 33, and the carrier gas species and the concentration of the carrier gas are controlled. By controlling these, it is possible to obtain a CNT 33 having the cup-stacked structure as shown in FIGS. 2A and 2B. In particular, by controlling the temperature for CNT growth to be 400° C. or less, the CNT 33 will have the cup-stacked structure. Further, by changing the temperature, the height of each of the graphene layers and the inclination of each of the graphene layers with respect to the longitudinal dimension of the CNT can be changed.

After the CNTs 33 have been grown, the CNTs 33 are doped with atoms such as Br. As the doping elements, apart from Br, Group 14 to 17 elements such as N and Cl are desired, and at least one of the above elements is used. In order to generate more carriers, several elements from the above may be used.

Doping in the present step is intended to increase carriers caused by the increase in Fermi energy, in particular. In addition, for the purpose of forming an energy level, metal atoms of Cr and Fe, for example, and a complex thereof can be used.

As the method of doping Group 14 to 17 elements, metal atoms, or complex of these atoms, in the case of performing the doping simultaneously with the CNT growth, a raw material including the doping element may be mixed as the raw material gas when the CNTs are to be grown by the CVD. Further, in the case of intercalation after the CNT growth, a method which can be used is to expose a substrate including the CNTs manufactured in a reduced-pressure and high-temperature state and a material including an element to be used for the intercalation to a same atmosphere. For example, performing exposure of doping element gas to the substrate at room temperature, performing doping gas exposure in a high-temperature or plasma atmosphere, and the like, can be applied. In particular, in order to obtain sufficient doping quantity at low temperature, an element gas exposure in the plasma atmosphere is preferred. Further, this doping may be performed simultaneously with the CNT forming step.

After the CNTs 33 are grown, as shown in FIG. 6E, the CNTs 33, the catalyst layer 32, the auxiliary catalyst layer 31, etc., of a field region are removed by CMP. At this time, the CNTs may be impregnated with an insulating film or metal for immobilizing the CNTs 33.

Finally, as shown in FIG. 6F, by forming an upper interconnect layer 45, an insulating film 42, and the like, the structure shown in FIG. 1 is completed.

According to the present embodiment described above, it is possible to manufacture a CNT via 30 whose interconnect resistance is extremely low, and resistance of a contact via in a semiconductor device can be reduced. Further, by only changing the deposition condition of the CNTs 33, cup-stacked CNTs suited to doping with Br, etc., can be manufactured, and thus the manufacturing can be carried out without needing to drastically change the manufacturing process.

Third Embodiment

In the present embodiment, an optimal structure of CNTs to be used for a CNT via, and a method of manufacturing the same will be described.

In the first and second embodiments, the CNT via 30 is formed by cup-stacked CNTs 33. Here, it is known that a CNT in which the graphene wall ends, which are formed from only a single element C, are exposed on the CNT layer sidewall has lower conductivity than a CNT of a hollow structure. This results from the fact that the dimension of the graphene layer in the direction of electron flow is less than that of the hollow structure CNT. Meanwhile, an advantage of realizing low resistance by the doping for such cup-stacked CNTs is similar to that of the graphene shown in FIG. 3. That is, also in the CNTs having the cup-stacked structure, it has been reported that the doping brings about an advantage of reducing resistivity by two orders of magnitude.

The via resistance in the present embodiment is determined by the conductivity resulting from the height of the graphene layer and the advantage of resistance reduction by the doping. Assuming that the resistance is reduced by two orders of magnitude by the doping, in order to realize lower resistance than in an average free length of 500 nm, which is the target of the current CNTs (producing approximately the same resistance as a W-plug), the height (average free length) of one graphene layer should be 5 nm or more (500 nm/100=5 nm). That is, in order to obtain the same advantage as that of the conventional metal via or hollow structure CNTs or a greater advantage than that, it is effective to stack graphene layers each having a height of 5 nm or more as shown in FIGS. 2A and 2B.

In order to form such a structure, the temperature when the CNTs are grown and the concentration of the raw material of the CNTs, and the carrier gas species and the concentration of the carrier gas species, for example, are controlled. More specifically, in order to structure the CNTs such that the graphene wall ends are exposed on the CNT layer sidewalls, a temperature in the deposition condition is controlled to be a low temperature of 400° C. or less, or control is performed such as supplying a raw material excessively. In this way, a CNT 33 having the cup-stacked structure as shown in FIG. 2 is obtained.

Modified Embodiments

The present invention is not limited to each of the embodiments described above.

An element which is used to dope the CNTs is not limited to Br. It is possible to use N or Cl as well. Further, several kinds of the above elements may be used for doping. Furthermore, the deposition condition of the CNTs can be changed as appropriate according to a specification, and may be any kind of condition as long as it defines the height of each of the graphene layers which constitute the CNTs to be 5 nm or greater.

In the present embodiment, a catalyst layer is formed at the bottom and the side of the contact via groove. However, a catalyst layer on a side surface is not necessarily required, and a catalyst layer may be formed on only the bottom. Further, in the present embodiment, although the auxiliary catalyst layer is formed as a ground of the catalyst layer, if diffusion of a component from the catalyst layer 32 to a lower layer contact does not become an issue, the auxiliary catalyst layer can be omitted.

In the second embodiment, although element doping is performed after the CNT via has been formed, it is possible to perform the element doping while the CNT via is being formed. To be specific, in the step shown in FIG. 6D, by adding atoms such as Br, N, and Cl atoms to source gas of the CVD, the element doping can be performed for the CNTs being manufactured. When the doping is performed simultaneously, CNTs in which the graphene wall ends are exposed on the CNT layer sidewalls can be formed by controlling the supply of the doping element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a substrate comprising a contact via groove;
   a catalyst layer for carbon nanotube growth which is formed on a bottom surface of the groove; and
   a carbon nanotube via which is embedded in the groove in which the catalyst layer is formed, and formed by a plurality of carbon nanotubes,
   wherein:
   each of the plurality of carbon nanotubes is formed such that a plurality of graphene layers are stacked in a state in which they are inclined depthwise with respect to the groove, and ends of the graphene layers are exposed on a sidewall of each of the plurality of carbon nanotubes, and
   the carbon nanotubes are doped with at least one element from the exposed ends of the graphene layers, said exposed ends of the graphene layers being a doping path on the sidewall of each of the plurality of carbon nanotubes.

2. The semiconductor device according to claim 1, wherein the catalyst layer is formed on a side surface of the groove in addition to the bottom surface of the groove.

3. The semiconductor device according to claim 2, wherein the element used to dope the carbon nanotubes is one of Br, Cl, and N.

4. The semiconductor device according to claim 3, wherein any of Group 14 to 17 elements is added to the carbon nanotubes in addition to the element used in the doping.

5. The semiconductor device according to claim 1, wherein the element used to dope the carbon nanotubes is one of Br, Cl, and N.

6. The semiconductor device according to claim 5, wherein any of Group 14 to 17 elements is added to the carbon nanotubes in addition to the element used in the doping.

7. The semiconductor device according to claim 1, wherein the carbon nanotube has a cup-stacked structure in which the graphene layers, each having a height of 5 nm or more, are stacked.

8. The semiconductor device according to claim 2, wherein the carbon nanotube has a cup-stacked structure in which the graphene layers, each having a height of 5 nm or more, are stacked.

* * * * *